(12) United States Patent
Liu et al.

(10) Patent No.: US 12,719,444 B2
(45) Date of Patent: Aug. 25, 2026

(54) RAISED FRAME LAYER IN BULK ACOUSTIC WAVE DEVICE

(71) Applicant: SKYWORKS GLOBAL PTE. LTD., Singapore (SG)

(72) Inventors: Jiansong Liu, Fremont, CA (US); Kwang Jae Shin, Yongin (KR); Yiliu Wang, Irvine, CA (US); Jong Duk Han, Yongin (KR); Jae Hyung Lee, Seoul (KR); Myung Hyun Park, Seongnam-si (KR)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 996 days.

(21) Appl. No.: 17/937,832

(22) Filed: Oct. 4, 2022

(65) Prior Publication Data

US 2023/0109382 A1 Apr. 6, 2023

Related U.S. Application Data

(60) Provisional application No. 63/252,456, filed on Oct. 5, 2021.

(51) Int. Cl.
*H03H 9/13* (2006.01)
*H03H 9/17* (2006.01)
*H03H 9/56* (2006.01)

(52) U.S. Cl.
CPC ............ *H03H 9/173* (2013.01); *H03H 9/132* (2013.01); *H03H 9/568* (2013.01)

(58) Field of Classification Search
CPC ......... H03H 9/132; H03H 9/173; H03H 9/568
USPC .......................................................... 310/348
See application file for complete search history.

(56) References Cited

U.S. PATENT DOCUMENTS 7,358,831 B2 4/2008 Larson, III et al.
9,385,303 B2 7/2016 Song et al.
9,401,692 B2 7/2016 Burak et al.
9,425,764 B2 8/2016 Burak et al.
9,444,426 B2 9/2016 Burak et al.
9,484,882 B2 11/2016 Burak et al.
(Continued)

FOREIGN PATENT DOCUMENTS

CN 111786645 A 10/2020
JP 2002374144 A 12/2002
(Continued)

OTHER PUBLICATIONS

Li et al., "Use of double-raised-border structure for quality factor enhancement of type II piston mode FBAR", Microsystem Technologies, Berlin, Germany, vol. 24, No. 7, May 2018, pp. 2991-2997.

*Primary Examiner* — Emily P Pham
*Assistant Examiner* — Monica Mata
(74) *Attorney, Agent, or Firm* — Lando & Anastasi, LLP

(57) ABSTRACT

A bulk acoustic wave (BAW) device is provided comprising a first electrode, a second electrode, a piezoelectric layer positioned between the first electrode and the second electrode, and a raised frame structure outside of a middle area of an active domain of the BAW device, the raised frame structure comprising one or more raised frame layer(s). At least one of the raised frame layer(s) comprises a tapered portion tapering in a direction towards the middle area of the active domain. A packaged module comprising such a BAW device is also provided. A wireless mobile device comprising such a packaged module is also provided.

24 Claims, 10 Drawing Sheets

(56) References Cited

U.S. PATENT DOCUMENTS 9,490,771 B2 11/2016 Burak et al.
9,853,626 B2 12/2017 Burak et al.
9,991,871 B2 6/2018 Zou et al.
10,284,173 B2 5/2019 Burak et al.
10,367,472 B2 7/2019 Burak et al.
10,404,231 B2 9/2019 Burak et al.
10,608,611 B2 3/2020 Tajic et al.
10,756,702 B2 8/2020 Lee et al.
10,812,037 B2 10/2020 Kyoung et al.
11,050,409 B2 6/2021 Park et al.
11,082,023 B2 8/2021 Shin et al.
11,190,164 B2 11/2021 Yen et al.
11,482,985 B2 10/2022 Fries et al.
11,502,667 B2 11/2022 Tajic et al.
11,601,112 B2 3/2023 Wang et al.
11,601,113 B2 3/2023 Wang et al.
2006/0103492 A1 5/2006 Feng et al.
2007/0057599 A1 3/2007 Motai et al.
2008/0024042 A1 1/2008 Isobe et al.
2008/0174389 A1 7/2008 Mori et al.
2009/0001848 A1 1/2009 Umeda et al.
2010/0013573 A1 1/2010 Umeda
2010/0019866 A1 1/2010 Hara et al.
2011/0090026 A1 4/2011 Nakahashi et al.
2011/0180391 A1 7/2011 Larson, III et al.
2011/0298564 A1 12/2011 Iwashita et al.
2011/0304412 A1 12/2011 Zhang
2012/0200195 A1 8/2012 Yokoyama et al.
2013/0033337 A1 2/2013 Nishihara et al.
2013/0063227 A1 3/2013 Burak et al.
2013/0106248 A1 5/2013 Burak et al.
2013/0140959 A1 6/2013 Shin et al.
2013/0193809 A1 8/2013 Araki
2014/0118091 A1 5/2014 Burak et al.
2014/0118092 A1 5/2014 Burak et al.
2014/0167566 A1 6/2014 Kando
2014/0203684 A1 7/2014 Yamamoto et al.
2014/0203686 A1 7/2014 Song et al.
2014/0292150 A1 10/2014 Zou et al.
2014/0339959 A1 11/2014 Lee et al.
2015/0214923 A1 7/2015 Tsuzuki
2016/0028371 A1 1/2016 Nishihara et al.
2016/0118957 A1 4/2016 Burak et al.
2016/0118958 A1 4/2016 Burak et al.
2016/0164487 A1 6/2016 Shin et al.
2017/0033769 A1 2/2017 Yokoyama
2017/0093374 A1 3/2017 Yatsenko et al.
2017/0214388 A1 7/2017 Irieda et al.
2017/0244021 A1 8/2017 Han et al.
2017/0244387 A1 8/2017 Matsuda et al.
2017/0264267 A1 9/2017 Tajic et al.
2017/0288121 A1 10/2017 Burak et al.
2017/0288122 A1 10/2017 Zou et al.
2017/0331457 A1 11/2017 Satoh
2018/0013401 A1 1/2018 Lee et al.
2018/0048287 A1 2/2018 Lee et al.
2018/0085787 A1 3/2018 Burak et al.
2018/0115302 A1 4/2018 Yeh et al.
2018/0219528 A1 8/2018 Liu et al.
2018/0254764 A1 9/2018 Lee et al.
2018/0278231 A1 9/2018 Hurwitz
2018/0309427 A1 10/2018 Kim et al.
2018/0351533 A1 12/2018 Lee et al.
2019/0036592 A1 1/2019 Shealy et al.
2019/0115901 A1 4/2019 Takahashi et al.
2019/0326873 A1 10/2019 Bradley et al.
2019/0363692 A1 11/2019 Nosaka
2020/0021273 A1 1/2020 Sung et al.
2020/0083861 A1 3/2020 Matsuo et al.
2020/0099359 A1 3/2020 Shin et al.
2020/0119713 A1 4/2020 Kim et al.
2020/0168785 A1 5/2020 Ikeuchi et al.
2020/0204148 A1 6/2020 Kim et al.
2020/0274520 A1 8/2020 Shin et al.
2020/0350888 A1 11/2020 Moulard
2020/0366266 A1 11/2020 Pollard et al.
2020/0366271 A1 11/2020 Kim et al.
2020/0373901 A1 11/2020 Liu et al.
2020/0373911 A1 11/2020 Wang et al.
2021/0028765 A1 1/2021 Wang et al.
2021/0083643 A1 3/2021 Liu et al.
2022/0311419 A1 9/2022 Komatsu et al.
2022/0368312 A1 11/2022 Wang et al.
2022/0393664 A1 12/2022 Liu et al.
2023/0006642 A1 1/2023 Liu et al.
2023/0188115 A1 6/2023 Hatano
2023/0261637 A1 8/2023 Matsuo et al.
2023/0299744 A1 9/2023 Zhang et al.

FOREIGN PATENT DOCUMENTS

JP 2007208845 A 8/2007
JP 2007288645 A 11/2007
JP 2014090414 A 5/2014
JP 2017158160 A 9/2017
WO 2006129532 A1 12/2006
WO 2007119556 A1 10/2007
WO 2008126473 A1 10/2008
WO 2019029912 A1 2/2019

102
102
104
106
108
112
110
114
123
124
124
125
126
126
130
150
152
α
β

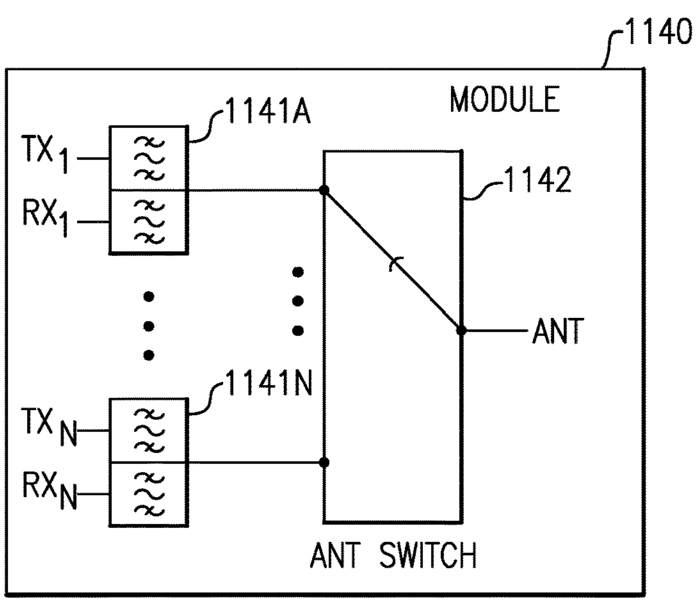
FIG.11
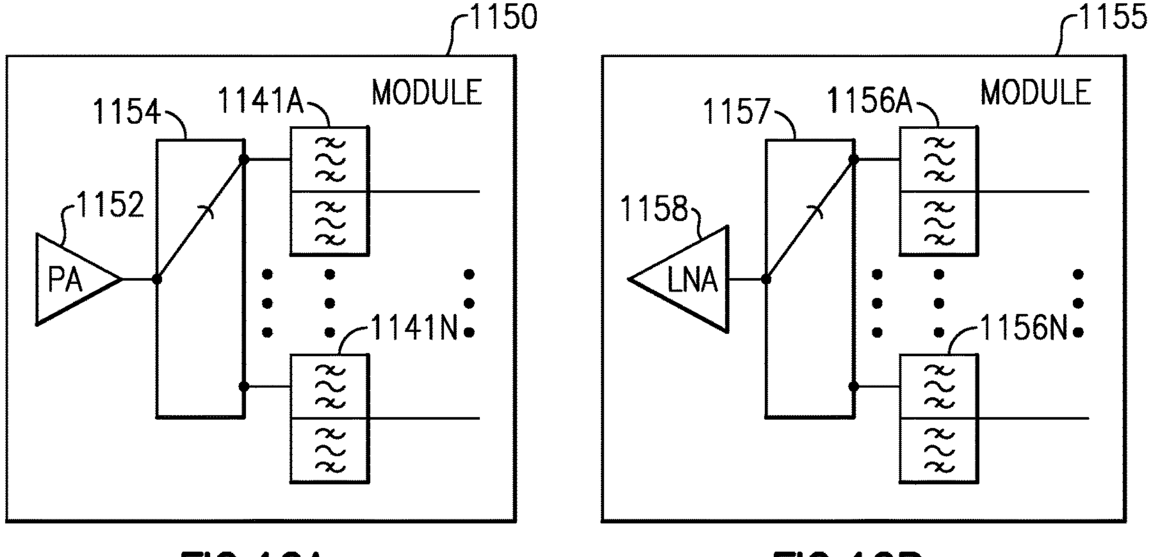
FIG.12A
FIG.12B
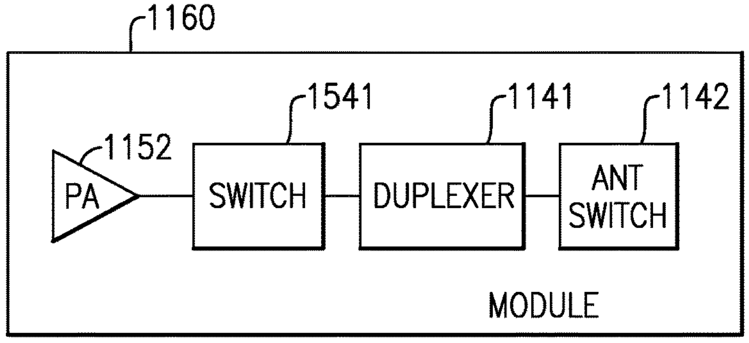
FIG.13

RAISED FRAME LAYER IN BULK ACOUSTIC WAVE DEVICE

CROSS-REFERENCE TO RELATED APPLICATIONS

This application claims priority under 35 U.S.C. § 119(e) to U.S. Provisional Patent Application Ser. No. 63/252,456, titled "RAISED FRAME LAYER IN BULK ACOUSTIC WAVE DEVICE," filed Oct. 5, 2021, the entire contents of which is incorporated herein by reference for all purposes.

BACKGROUND

Field

The present disclosure generally relates to acoustic wave devices, and particularly to bulk acoustic wave devices.

Description of Related Art

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and solidly mounted resonators (SMRs). In BAW resonators, acoustic waves propagate in a bulk of a piezoelectric layer.

For high performance BAW filters, low insertion loss, low Gamma loss, and high quality factor (Q) are generally desirable. However, desired levels of low insertion loss, low Gamma loss, and high quality factor (Q) can be difficult to achieve.

SUMMARY

According to a number of embodiments, the present disclosure relates to a bulk acoustic wave (BAW) device comprising a first electrode, a second electrode, a piezoelectric layer positioned between the first electrode and the second electrode, and a raised frame structure outside of a middle area of an active domain of the BAW device, the raised frame structure comprising one or more raised frame layer(s). At least one of the raised frame layer(s) comprises a tapered portion tapering in a direction towards the middle area of the active domain.

The raised frame structure may comprise a first raised frame layer and a second raised frame layer.

The first raised frame layer may be supported by the first electrode away from the piezoelectric layer, the first raised frame layer partially covering the first electrode and leaving at least the middle area of the active domain uncovered by the first raised frame layer. The middle area of the active domain may be covered by other layer such as a passivation layer.

The second raised frame layer may be located between the first electrode and the second electrode.

The second raised frame may have a lower acoustic impedance than at least one of the first electrode and the second electrode.

At least one of the first raised frame layer and the second raised frame layer may comprise a tapered portion.

The first raised frame layer may have a tapered portion having a taper angle, $\alpha$, of $5° \leq \alpha \leq 50°$, and/or the second raised frame layer may have a tapered portion having a taper angle, $\beta$, of $5° \leq \beta \leq 50°$, or the first raised frame layer may have a tapered portion having a taper angle, $\alpha$, of $5° \leq \alpha \leq 30°$ and/or the second raised frame layer may have a tapered portion having a taper angle, $\beta$, of $5° \leq \beta \leq 30°$.

In some embodiments, the taper angle $\alpha$ is not equal to the taper angle $\beta$.

The thickness of the first raised frame layer may be within the range of $0.03\lambda$ to $0.3\lambda$, $\lambda$ being $\lambda=2h$ and h being the thickness of the middle area of the BAW device.

The second raised frame layer may be configured to move a frequency of a raised frame mode away from a main resonant frequency of the BAW device.

The raised frame structure may be configured to block lateral energy leakage from the active domain to a passive domain of the BAW device, the passive domain being an area the BAW outside the active domain.

The acoustic impedance of the second raised frame layer may be lower than an acoustic impedance of the piezoelectric layer.

The second raised frame layer may comprise one or more of silicon dioxide ($SiO_2$), silicon nitride (SiN), silicon carbide (SiC), or a metal having low impedance, such as aluminum, titanium, or beryllium.

The second electrode may comprise at least one of molybdenum, tungsten, ruthenium, platinum, iridium, or osmium.

The second raised frame layer may be positioned between the piezoelectric layer and the first electrode.

The second raised frame layer may be positioned between the piezoelectric layer and the second electrode.

The second raised frame layer may be disposed along an edge of the active domain.

The BAW device may comprise at least one passivation layer.

The passivation layer may at least a part of the raised frame structure and at least a part of the first electrode.

he passivation layer may comprise one or more recesses in the middle area of the active domain.

The first raised frame layer and the piezoelectric layer may be disposed on opposite sides of the first electrode, and the second raised frame layer may be positioned between the piezoelectric layer and the first electrode.

The first raised frame layer may have a higher density than the piezoelectric layer.

The first raised frame layer may comprise the same material as the first electrode.

The BAW device may comprise an air cavity.

The second electrode may be positioned between the first electrode and the air cavity.

The air cavity and the piezoelectric layer may be positioned on opposite sides of the second electrode.

The BAW device may comprise an acoustic Bragg reflector.

The second electrode may be positioned between the first electrode and the acoustic Bragg reflector.

The acoustic Bragg reflector and the piezoelectric layer may be positioned on opposite sides of the second electrode.

According to a number of embodiments, the present disclosure relates to a packaged module comprising a packaging substrate, an acoustic wave filter on the packaging substrate and configured to filter a radio frequency signal, the acoustic wave filter including a BAW device and a radio frequency (RF) component electrically coupled to the acoustic wave filter and positioned on the packaging substrate, the acoustic wave filter and the radio frequency component being enclosed within a common package. The BAW device included in the packaged module includes a first electrode, a second electrode, a piezoelectric layer positioned between the first electrode and the second electrode, and a raised frame structure outside of a middle area of an active domain of the BAW device, the raised frame structure including one or more raised frame layer(s). At least one of the raised frame layer(s) includes a tapered portion tapering in a direction towards the middle area of the active domain.

The RF component may comprise at least one of a RF amplifier or a RF switch.

According to a number of embodiments, the present disclosure relates to a wireless mobile device comprising a packaged module, the packaged module including a packaging substrate, an acoustic wave filter on the packaging substrate and configured to filter a radio frequency signal, the acoustic wave filter including a BAW device and a radio frequency (RF) component electrically coupled to the acoustic wave filter and positioned on the packaging substrate, the acoustic wave filter and the radio frequency component being enclosed within a common package. The BAW device included in the packaged module includes a first electrode, a second electrode, a piezoelectric layer positioned between the first electrode and the second electrode, and a raised frame structure outside of a middle area of an active domain of the BAW device, the raised frame structure including one or more raised frame layer(s). At least one of the raised frame layer(s) includes a tapered portion tapering in a direction towards the middle area of the active domain.

Embodiments disclosed herein may address various problems. One or more embodiments may address one or more of the problems concerning the insertion loss, transition band steepness, and quality factor (Q) of a BAW device, or other problems of BAW device performance characteristics, such as acoustic performance.

BRIEF DESCRIPTION OF THE DRAWINGS

Various aspects of at least one embodiment are discussed below with reference to the accompanying figures which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures:

FIG. 11 is a schematic block diagram of a module that includes an antenna switch and duplexers that include one or more raised frame bulk acoustic wave devices;

FIG. 12A is a schematic block diagram of a module that includes a power amplifier, a radio frequency switch, and duplexers that include one or more raised frame bulk acoustic wave devices;

FIG. 12B is a schematic block diagram of a module that includes a low noise amplifier, a radio frequency switch, and acoustic wave filters that include one or more raised frame bulk acoustic wave devices;

FIG. 13 is a schematic block diagram of a module that includes a power amplifier, a radio frequency switch, and a duplexer that includes one or more raised frame bulk acoustic wave devices;

DETAILED DESCRIPTION

Figure 1:
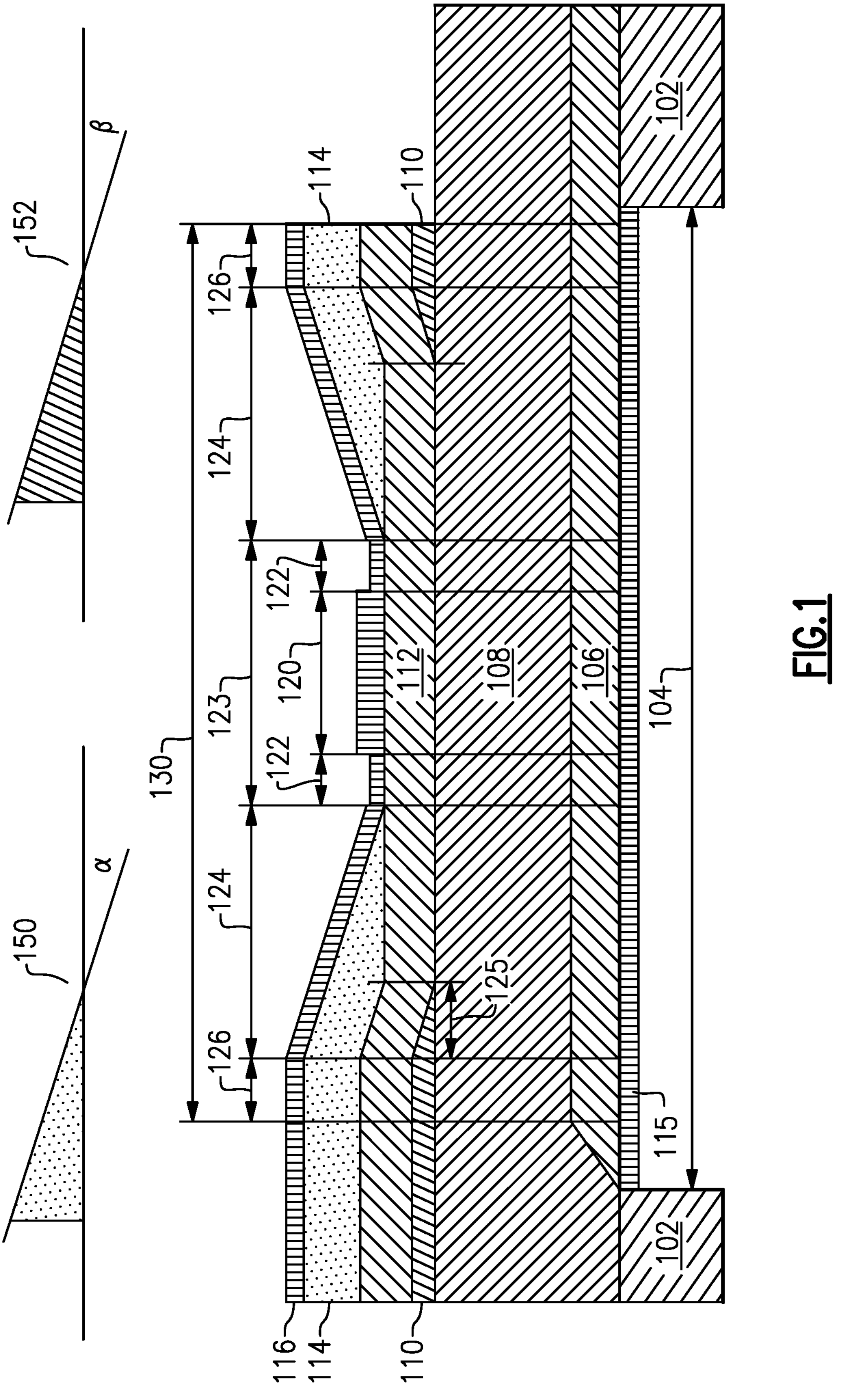
FIG. 1 is a cross-sectional view of a raised frame bulk acoustic wave device having a passivation layer and raised frame layers with tapered portions according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

For developing high performance bulk acoustic wave (BAW) filters, reducing insertion loss and decreasing Gamma loss is generally desirable. To achieve a low insertion loss, BAW resonators typically have a high quality factor (Q). To achieve a high Q, a raised frame, which can be referred to as a border ring, can block lateral energy leakage from an active domain of a BAW resonator to a passive domain of the BAW resonator. A raised frame can improve Q, although it may not be able to trap all leakage energy. The raised frame can generate a relatively large spurious mode, which can be referred to as a raised frame mode, below a main resonant frequency of a BAW resonator. This can cause Gamma degradation in carrier aggregation bands for a filter. Gamma can refer to a reflection coefficient. A low Gamma loss can be achieved with a raised frame spurious mode (RaF mode) away from carrier aggregation bands.

Aspects of this disclosure relate to a BAW resonator that comprises a raised frame structure having at least one raised frame layer with a tapered portion that can achieve low insertion loss and steeper transition band. The raised frame structure may comprise one or more raised frame layer(s). For example, the raised frame structure may comprise a first raised frame layer and a second raised frame layer.

One of the raised frame layers, for example, the second raised frame layer, may include a low acoustic impedance material, such as silicon dioxide ($SiO_2$), silicon nitride (SiN), or silicon carbide (SiC), disposed between electrodes that are on opposing sides of a piezoelectric layer. For instance, the low acoustic impedance material may be disposed between a top electrode and a piezoelectric layer of a BAW wave resonator. The raised frame structure may be disposed along a perimeter of an active domain of the BAW resonator.

One of the raised frame layers, for example, the first raised frame layer, may comprise a relatively heavy material. The second raised frame layer may be formed of the same material as an electrode of the BAW resonator.

Due to a low acoustic impedance, the frequency of a raised frame domain generating a relatively strong raised frame spurious mode can be significantly lower than for a similar raised frame domain without the second raised frame layer with a low acoustic impedance. With the low acoustic impedance, the raised frame mode for the raised frame structure may be outside of a carrier aggregation band so as not to provide a Gamma loss. For example, in a carrier aggregation implementation, a multiplexer may include a common node arranged to receive a carrier aggregation signal, a first filter having a passband associated with a first carrier of the carrier aggregation signal, and a second filter coupled to the first filter at the common node and having a second passband associated with a second carrier of the carrier aggregation signal. The first filter may include a BAW resonator with a raised frame structure according to an embodiment disclosed herein. The BAW resonator with the raised frame structure may increase Gamma for the first filter in the passband of the second filter.

Additionally, due to a relatively low frequency of the raised frame spurious mode, the difference between the effective acoustic impedance of the raised frame domain and the acoustic impedance of the active domain is larger than for a raised frame structure that includes a single layer corresponding to the first raised frame layer. The raised frame structure may provide a high mode reflection of a lateral energy and decrease mode conversion from the main mode to other lateral modes around the anti-resonance frequency. Accordingly, Q can be significantly increased.

Although embodiments disclosed herein may be discussed with reference to a raised frame structure with two raised frame layers, any suitable principles and advantages discussed herein can be applied to a raised frame structure that includes one or more raised frame layer(s).

Example BAW resonators with two raised frame layers will now be discussed. Any suitable principles and advantages of these raised frame layers can be implemented together with each other in a raised frame BAW device.

Embodiments of raised frame BAW devices will be discussed with reference to example cross-sectional figures. FIGS. 1 to 5 illustrate example cross-sections of raised frame BAW devices. As used herein, the term "top surface," when referring to a layer of the BAW device, means a surface of the layer that is facing away from and is farther from a substrate of the BAW device. The term "bottom surface," when referring to a layer of the BAW device, means a surface of the layer that is facing and is closer to a substrate of the BAW device. Any suitable combination of features of the BAW devices of FIGS. 1 to 5 may be combined with each other. Any of the BAW devices disclosed herein may be utilized as BAW resonators in a filter arranged to filter a radio frequency signal.

Figure 2:
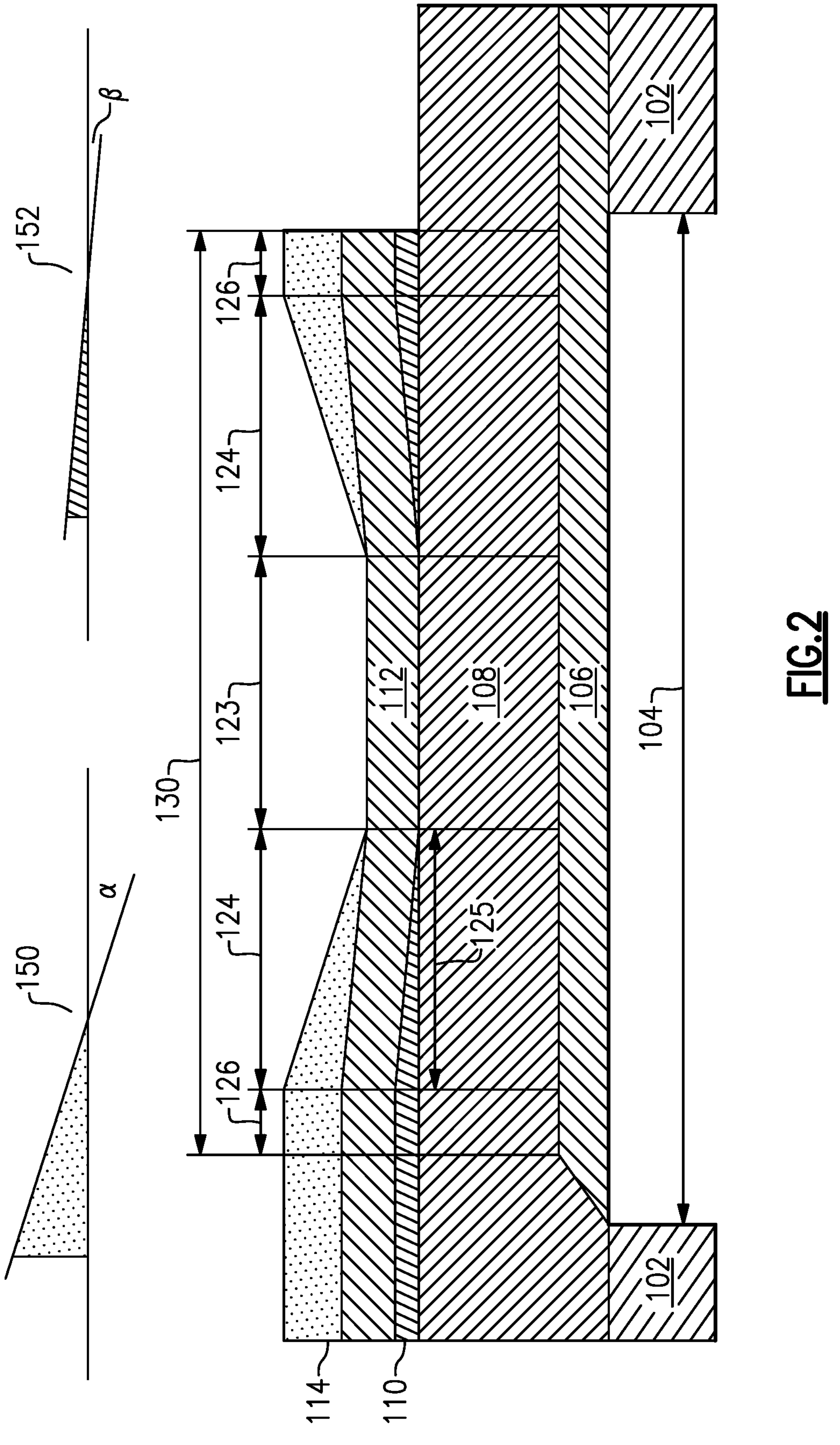
FIG. 2 is a cross-sectional view of a raised frame bulk acoustic wave device having raised frame layers with tapered portions according to an embodiment.

FIG. 2 is a cross-sectional view of a raised frame BAW device comprising raised frame layers (114, 110) having tapered portions (124, 125) according to an embodiment. As illustrated, the raised frame bulk acoustic wave device includes a piezoelectric layer (108), a first electrode (112), a second electrode (106), a first raised frame layer (114), a second raised frame layer (110), a substrate (102), and an air cavity (104). The substrate (102) may be a silicon substrate.

An active region or active domain (130) of the BAW device is defined by the portion of the BAW device in which the piezoelectric layer (108) overlaps with both the first electrode (112) and the second electrode (106). The region of the BAW device that is outside the active domain (130) may be defined as a passive domain.

At least a portion (124, 126) of the raised frame (110, 114) structure is included in an active region (130) of the BAW device. The raised frame (110, 114) structure can improve Q significantly due to highly efficient reflection of lateral energy.

The first raised frame layer (114) may be a mass loading raised frame (ML-RaF) such as a metal raised frame (MRaF). As illustrated in FIG. 2, the first raised frame layer (114) overlaps with the second raised frame layer (110) in the active domain (130) of the BAW device. The first raised frame layer (114) may be formed of the same material as the first electrode (112). This can be convenient from a manufacturing perspective. The first raised frame layer (114) may be made of a relatively high density material. For example, the first raised frame layer (114) may include molybdenum (Mo), tungsten (W), ruthenium (Ru), the like, or any suitable alloy thereof. The first raised frame layer (114) may be a metal layer. Alternatively, the first raised frame layer (114) may be a suitable non-metal material with a relatively high density. The density of the first raised frame layer (114) may be similar or higher than the density of the first electrode (112). The first raised frame layer (114) may have a relatively high acoustic impedance.

The second raised frame layer (110) is positioned between the first electrode (112) and the second electrode (106). As illustrated in FIG. 2, the second raised frame layer (110) is positioned between the piezoelectric layer (108) and the first electrode (112). The second raised frame layer (110) may be made of a low acoustic impedance (LAI) material. For example, the second raised frame layer (110) may be an oxide raised frame (ORaF). The low acoustic impedance material may have a lower acoustic impedance than the first electrode (112). The low acoustic impedance material may have a lower acoustic impedance than the second electrode (106). The low acoustic impedance material may have a lower acoustic impedance than the piezoelectric layer (108). For example, the second raised frame layer (110) may be a $SiO_2$ layer. Because $SiO_2$ is already used in a variety of BAW devices, a $SiO_2$ second raised frame layer (110) can be relatively easy to manufacture. Alternatively, the second raised frame layer (110) may be a SiN layer, a SiC layer, or any other suitable low acoustic impedance layer. The second raised frame layer (110) may have a relatively low density. The second raised frame layer (110) may extend beyond the active region of the BAW device as shown in FIG. 2. This may be for manufacturability reasons in certain instances.

The second raised frame layer (110) may reduce an effective electromechanical coupling coefficient ($k^2$) of the raised frame domain of the BAW device relative to a similar device without the second raised frame layer (110). This may reduce excitation strength of a raised frame spurious mode. Moreover, the second raised frame layer (110) may move the frequency of the raised frame mode relatively far away from the main resonant frequency of the BAW device, which may reduce the effect on Gamma loss.

As illustrated in FIG. 2, the first raised frame layer (114) comprises a tapered portion (124) and a non-tapered portion (126). The tapered portion (124) of the first raised frame layer (114) is located adjacent to the middle area (123). The tapered portion of the first raised frame layer may have a tapered profile having decreasing thickness in a direction toward the middle area (123). The non-tapered portion (126) is located adjacent to the tapered portion (124) and away from the middle area (123). The non-tapered portion (126) may have a constant thickness.

The top surface of the tapered portion (124) of the first raised frame layer (114) may form a taper angle, α, with the top surface of the middle area (123) of the first electrode (112), as illustrated in the inset (150) of FIG. 2. The taper angle, α, is smaller than 90°. Optionally, the taper angle, α, may be significantly smaller than 90°, for example, in a range of 5° to 50° or in a range of 5° to 30°.

Similarly, the top surface of the tapered portion (125) of the second raised frame layer (110) may form a taper angle, β, with the top surface of the middle area (123) of the piezoelectric layer (108), as illustrated in the inset (152) of FIG. 2. The taper angle, β, is smaller than 90°. Optionally, the taper angle, β, may be significantly smaller than 90°, for example, in a range of 5° to 50° or in a range of 5° to 30°. Taper angle β may be equal to or different from the taper angle α. Optionally, the taper angle α is smaller than or greater than the taper angle β.

Figure 6:
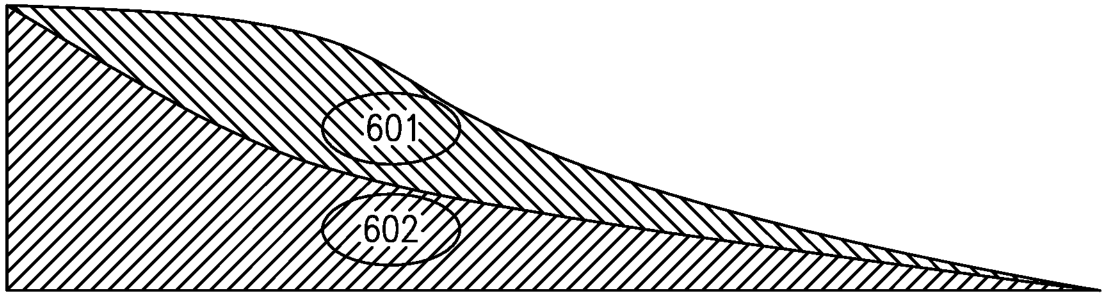
FIG. 6 illustrates examples of non-linear taper profiles a tapered portion of a raised frame may have.

The tapered portion tapers continually and gradually from a first thickness to a tapering point in the direction towards the middle area (123). The top surface of the tapered portion (124) of the first raised frame layer (114) and/or the top surface of the tapered portion (125) of the second raised frame layer (110) may have a linear or non-linear profile. Examples of such non-linear profiles (601, 602) are illustrated in FIG. 6. Such non-linear profiles may comprise one or more of parabolic, exponential, and any type of curved profile section. In such implementations, the taper angle(s), α and/or β, may be defined as an average angle formed by the top surface of the middle area (123) of the first electrode (112) and the top surface of the tapered portion (124) of the first raised frame layer (114) and/or the tapered portion (125) of the second raised frame layer (110). Alternatively, the taper angle(s), α and/or β, may be defined as the angle between the plane passing through the start of the taper and the end of the taper with the top surface of the middle area (123).

As a result of the slopes formed by the taper angles α and/or β, the adjacent layers to the first raised frame layer (114) and/or the second raised frame layer (110) may also comprise one or more sloped surface(s).

Figure 7:
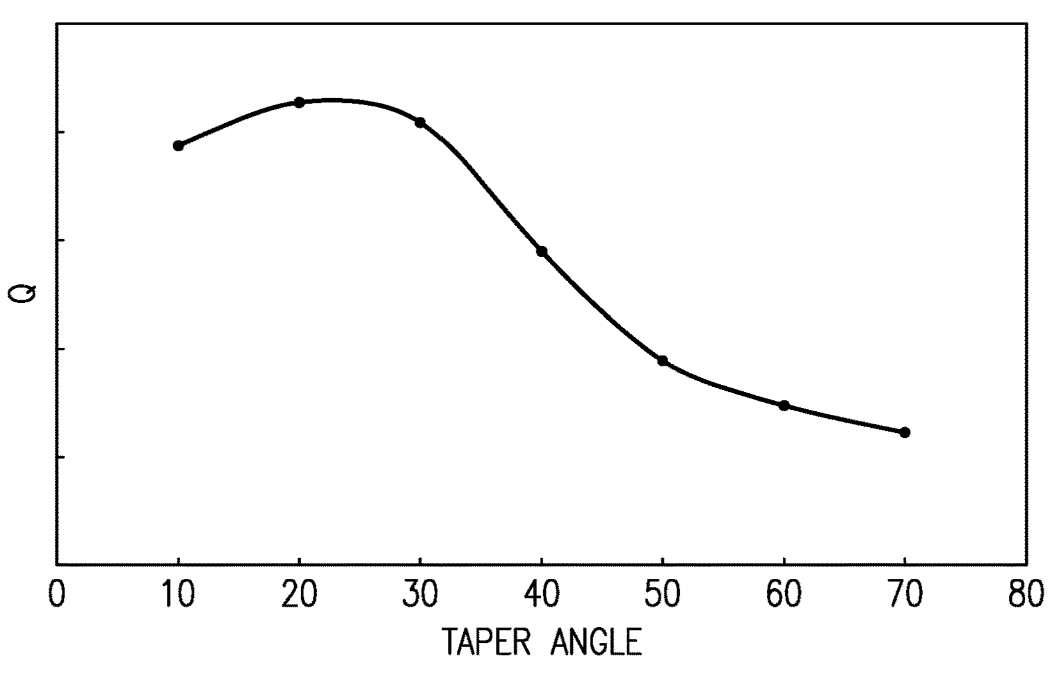
FIG. 7 is a graph showing an example relationship between quality factor (Q) and a taper angle of a tapered portion of a raised frame.

FIG. 7 is a graph showing the results of a simulation modelling the relationship between Q and the taper angle, α. The Q values in the example graph shown in FIG. 7 are relative, an absolute scale is not required to understand the trend shown. The taper angle, α, may influence various performance characteristics of the BAW device. For example, as shown in FIG. 7, the taper angle, α, may influence the Q of the BAW device. Therefore, the value of the taper angle, α, may be determined in a way to optimize one or more performance characteristic(s) of the BAW device. For example, using the example Q-taper angle relationship shown in FIG. 7, a desirable value of the taper angles, α, may be determined to be in a range of 10° to 30°.

The taper angle β, may also influence various performance characteristics of the BAW device in a similar way as the taper angle, α. The relationship between Q and the taper angle, β, is similar to the relationship between Q and the taper angle, α, shown in FIG. 7. This means that the value of the taper angle, β, may also be determined in a way to optimize one or more performance characteristic(s) of the BAW device in the same way. In particular, a desirable value of the taper angle, β, is also found to be in a range of 10° to 30°.

Having a plurality of raised frame layers in the BAW device, as shown in the examples of FIGS. 1 to 5 having two raised frame layers (110, 114), may further improve one or more performance characteristic(s) of the BAW device, and in particular improves the Q value. This is because introducing a taper into an additional raised frame results in more lateral wave modes being reflected back into the active region.

Figure 8:
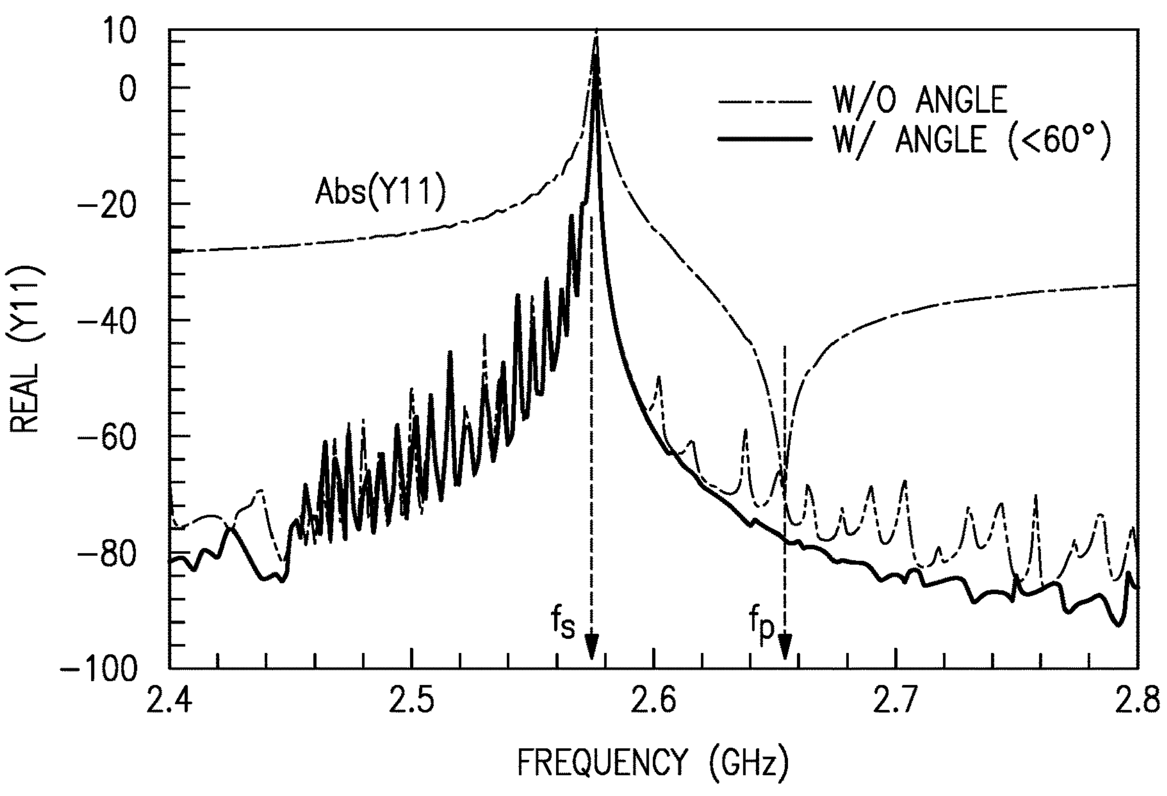
FIG. 8 is a graph showing example admittance (Y11)-frequency responses in example embodiments having a raised frame with a tapered portion (e.g., W/Angle (<60°)) and without a tapered portion (W/O Angle)

FIG. 8 is a graph showing example admittance (Y11)-frequency responses in example embodiments having a raised frame with a tapered portion (e.g., W/Angle (<60°)) and without a tapered portion (W/O Angle). As shown in FIG. 8, the example embodiment with a tapered portion has an improved quality factor ($Q_p$) at the parallel resonance frequency $f_p$, when compared to the example embodiment without a tapered portion. Furthermore, FIG. 8 also shows suppressed spurious modes for the example embodiment with a tapered portion.

The thickness of the non-tapered portion (126) of the first raised frame layer (114) may be determined so as to optimize acoustic properties, such as Q. For example, the thickness of the non-tapered portion (126) of the first raised frame layer (114) may be in a range of 0.03λ to 0.3λ, wherein λ is defined as λ=2h, and his the thickness of the middle area (123) of the BAW device. The thickness of the middle area (123), h, may include a thickness of an optional passivation layer (116) covering the top surface of the first raised frame layer (114) and the middle area (123) of the first electrode (112), as is illustrated in FIG. 1. The thickness of the middle area (123), h, may also include a thickness of one or more optional passivation layers (115) covering the bottom surface of the second electrode (106) as also illustrated in FIG. 1.

The piezoelectric layer (108) may be disposed between the first electrode (112) and the second electrode (106). The piezoelectric layer (108) may comprise aluminum nitride (AlN) or any other suitable piezoelectric material.

The first electrode (112) may have a relatively high acoustic impedance. For example, the first electrode (112) may comprise molybdenum (Mo), tungsten (W), ruthenium (Ru), iridium (Jr), platinum (Pt), Ir/Pt, or any suitable alloy and/or combination thereof.

Similarly, the second electrode (106) may have a relatively high acoustic impedance. For example, the second electrode (106) may comprise molybdenum (Mo), tungsten (W), ruthenium (Ru), iridium (Jr), platinum (Pt), Ir/Pt, or any suitable alloy and/or combination thereof. The second electrode (106) may be formed of the same material as the first electrode (112) in certain instances.

Figure 3:
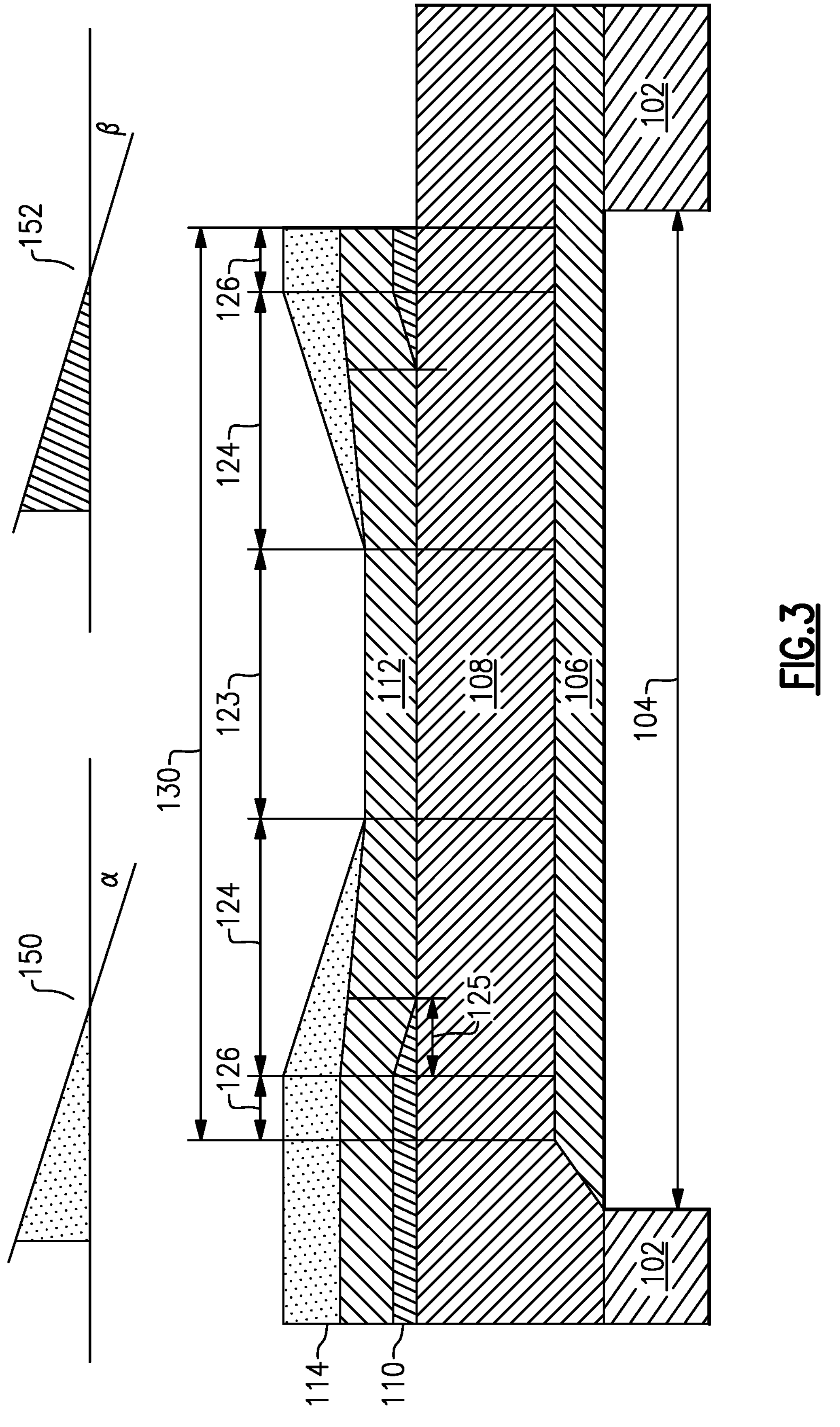
FIG. 3 is a cross-sectional view of a raised frame bulk acoustic wave device having raised frame layers with tapered portions according to another embodiment.

As illustrated in FIG. 2, the first raised frame layer (114) and the second raised frame layer (110) may completely overlap with each other in the active region (130) of the BAW device. However, in other embodiments, the first raised frame layer (114) and the second raised frame layer (110) may only partially overlap with each other in the active region (130) of the BAW device, for example, as illustrated in FIG. 3.

A raised frame domain (124, 125, 126) of the BAW device is defined by the portion of the BAW device in which the first raised frame layer (114) or the second raised frame layer (110) overlaps with the active domain (130). As the first raised frame layer (114) and the second raised frame layer (110) of the embodiment illustrated in FIG. 2 completely overlap, the raised frame domain (124, 125, 126) for the first raised frame layer (114) and the second raised frame layer (110) are identical. However, in other embodiments wherein the first raised frame layer (114) and the second raised frame layer (110) only partially overlap, the raised frame domain (124, 125, 126) for the first raised frame layer (114) and the second raised frame layer (110) may not be identical. The raised frame domain (124, 125, 126) may comprise a gradient raised frame domain (124, 125) and non-gradient raised frame domain (126). The gradient raised frame domain (124, 125) is defined by the portion of the raised frame domain (124, 125, 126) in which the tapered portion (124, 125) of the raised frame layer (114) or the second raised frame layer (110) is located. The non-gradient raised frame domain (126) is defined by the portion of the raised frame domain (124, 125, 126) in which the non-tapered portion (126) of the raised frame layer (114) or the second raised frame layer (110) is located. In the embodiment illustrated in FIG. 2, the first raised frame layer (114) and the second raised frame layer (110) have identical gradient raised frame domains (124, 125) and the non-gradient raised frame domains (126). However, in other embodiments wherein the tapered portions (124, 125) and/or the non-tapered portions (126) of the first raised frame layer (114) and the second raised frame layer (110) do not completely overlap, the first raised frame layer (114) and the second raised frame layer (110) may not have identical gradient raised frame domains (124, 125) and/or the non-gradient raised frame domains (126).

The increased thickness of the first raised frame layer (114) may increase the overall thickness of the BAW device in the raised frame domain (124, 125, 126). Accordingly, the BAW device may have a greater thickness in the raised frame domain (124, 125, 126) than in other portions of the active domain (130), such as the middle area (123) of the active domain (130).

Similarly, the increased thickness of the second raised frame layer (110) may also, or instead, increase the overall thickness of the BAW device in the raised frame domain (124, 125, 126). Accordingly, the BAW device may have a greater thickness in the raised frame domain (124, 125, 126) than in other portions of the active domain (130), such as the middle area (123) of the active domain (130).

The size of the area of the tapered portion (124) of the first raised frame layer (114) may be dependent on one or more of: the taper angle $\alpha$ of the tapered portion (124) of the first raised frame layer (114), the taper profile of the tapered portion (124) of the first raised frame layer (114), and the thickness of the non-tapered portion (126) of the first raised frame layer (114). Similarly, the size of the area of the tapered portion (125) of the second raised frame layer (110) may be dependent on one or more of: the taper angle $\beta$ of the tapered portion (125) of the second raised frame layer (110), the taper profile of the tapered portion (125) of the second raised frame layer (110), and the thickness of the non-tapered portion (126) of the second raised frame layer (110).

In the example illustrated in FIG. 2, although the taper angle $\alpha$ is larger than the taper angle $\beta$, the sizes of the areas of the first raised frame layer (114) and the second raised frame layer (110) are the same or similar because the first raised frame layer (114) has a larger thickness than the second raised frame layer (110).

FIG. 3 is a cross-sectional view of a raised frame BAW device according to another embodiment. The raised frame BAW device illustrated in FIG. 3 is similar to the raised frame BAW device of FIG. 2, except that the first raised frame layer (114) and the second raised frame layer (110) of FIG. 3 only partially overlap with each other in the active region (130) of the BAW device. The first raised frame layer (114) of the BAW device illustrated in FIG. 3 covers a larger area of the active domain (130) than the second raised frame layer (110) does. However, in other embodiments the second raised frame layer (110) may cover a larger area of the active domain (130) than first raised frame layer (114) does.

In the example illustrated in in FIG. 3, although the taper angles $\alpha$ and $\beta$ are the same or similar, the size of the area of the first raised frame layer (114) is larger than the size of the area of the second raised frame layer (110) because the first raised frame layer (114) has a larger thickness than the second raised frame layer (110).

Figure 4:
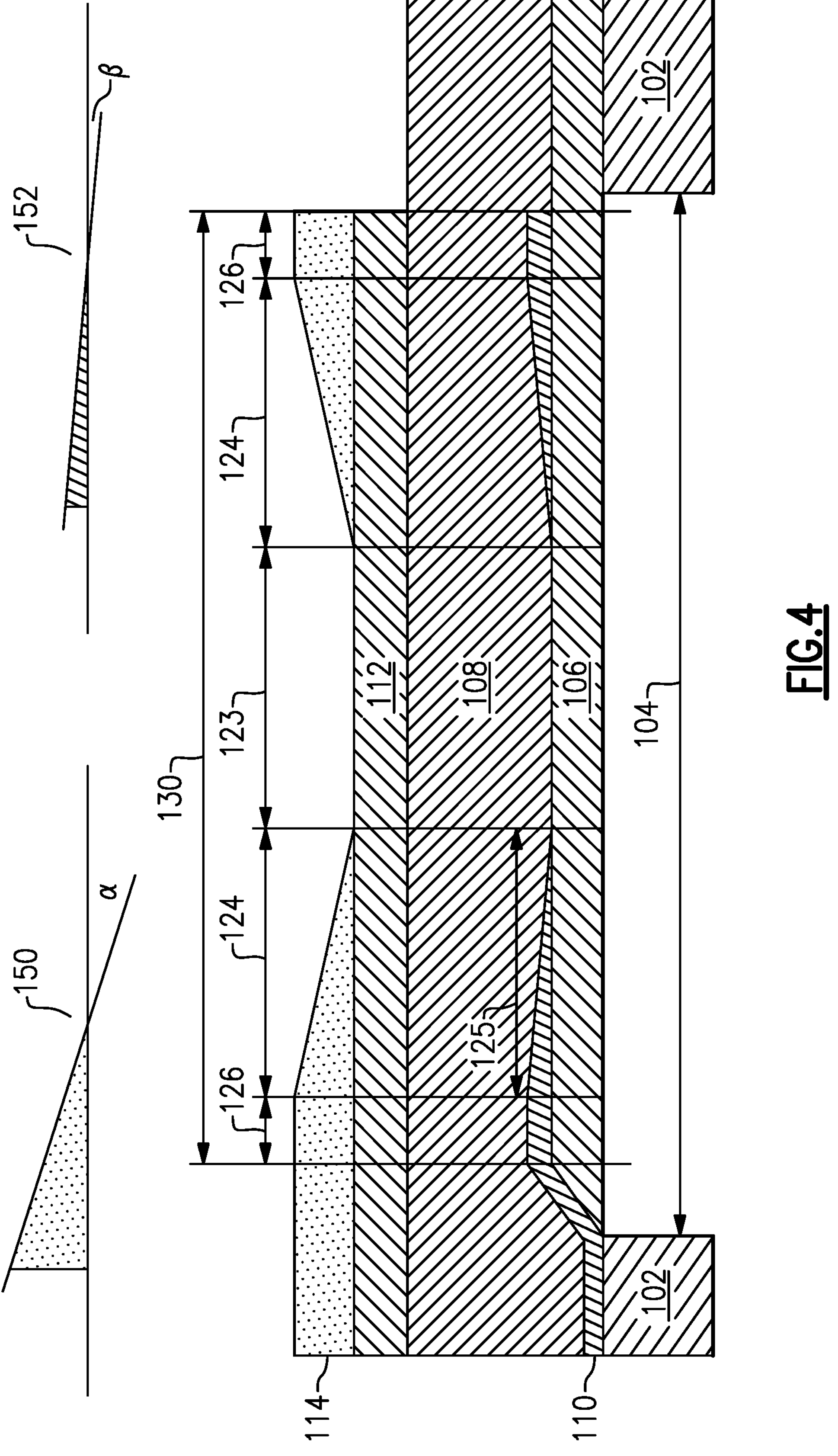
FIG. 4 is a cross-sectional view of a raised frame bulk acoustic wave device having raised frame layers with tapered portions according to another embodiment.

FIG. 4 is a cross-sectional view of a raised frame BAW device according to another embodiment. The raised frame bulk acoustic device illustrated in FIG. 4 is similar to the raised frame BAW device of FIG. 2, except that the second raised frame layer (110) of FIG. 4 is located between the piezoelectric layer (108) and the second electrode (106).

In the example illustrated in FIG. 4, although the taper angle $\alpha$ is larger than the taper angle $\beta$, the sizes of the areas of the first raised frame layer (114) and the second raised frame layer (110) are the same or similar because the first raised frame layer (114) has a larger thickness than the second raised frame layer (110).

Figure 5:
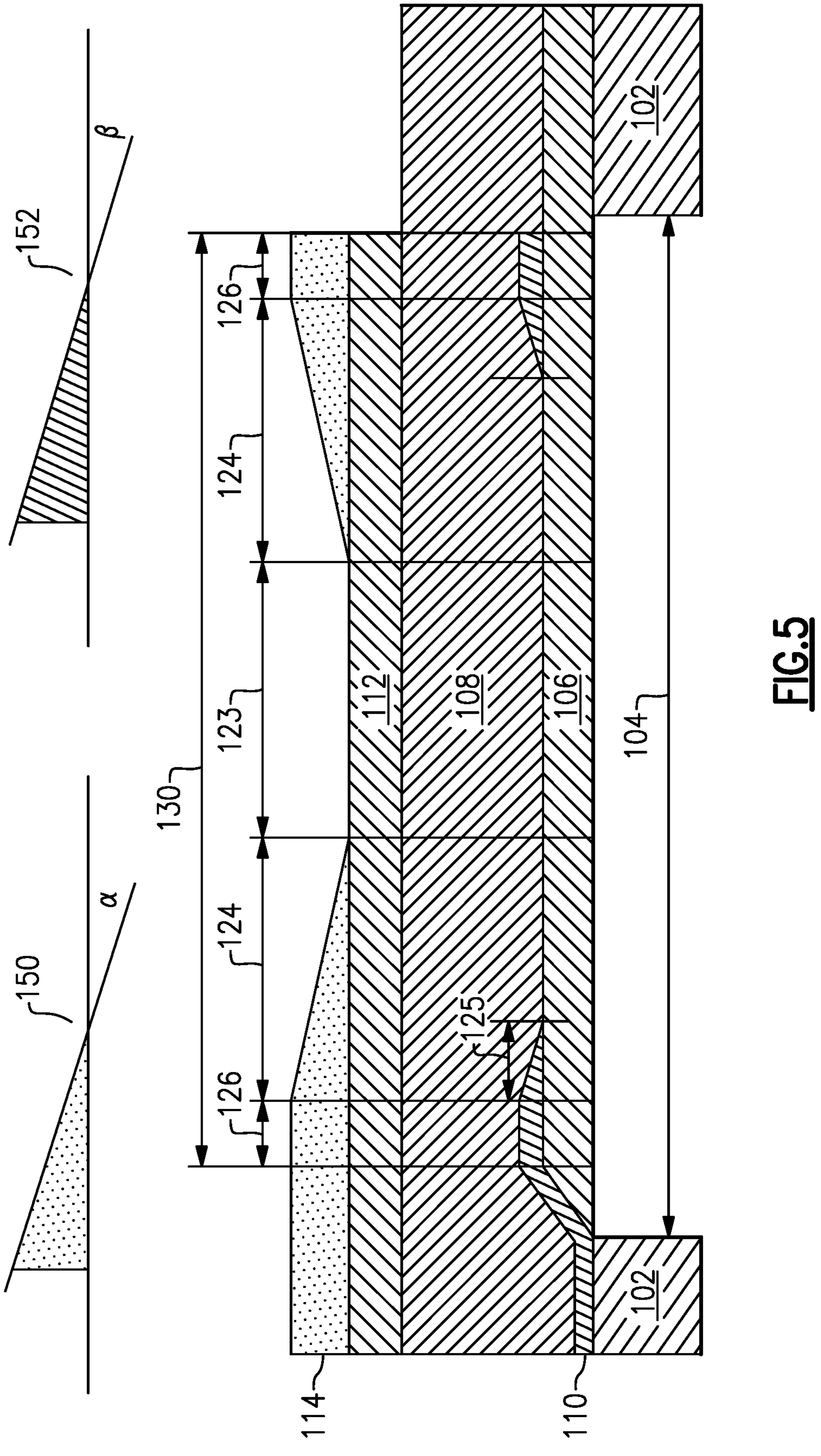
FIG. 5 is a cross-sectional view of a raised frame bulk acoustic wave device having raised frame layers with tapered portions according to another embodiment.

FIG. 5 is a cross-sectional view of a raised frame BAW device according to another embodiment. The raised frame bulk acoustic device illustrated in FIG. 5 is similar to the raised frame BAW device of FIG. 3, except that the second raised frame layer (110) of FIG. 5 is located between the piezoelectric layer (108) and the second electrode (106).

In the example illustrated in FIG. 5, although the taper angles $\alpha$ and $\beta$ are the same or similar, the size of the area of the first raised frame layer (114) is larger than the size of the area of the second raised frame layer (110) because the first raised frame layer (114) has a larger thickness than the second raised frame layer (110).

Optionally, the raised frame BAW device may comprise a passivation layer (116). As illustrated in FIG. 1, the passivation layer (116) may be located adjacent to the first raised frame layer (114) and the middle area (123) of the first electrode (112). The passivation layer (116) may comprise one or more of silicon dioxide ($SiO_2$), silicon nitride (SiN), or silicon carbide (SiC). The passivation layer (116) may be formed with different thicknesses in different regions of the BAW device. For example, as shown in FIG. 1, the passivation layer (116) may be thinner in a recessed frame domain (122) than in other regions. The passivation layer (116) may comprise one or more sub-layers that comprise different materials. Similarly, the bottom surface of the second electrode may also comprise an optional passivation layer (115).

Optionally, the raised frame BAW device may further comprise one or more additional raised frame layer(s) resembling the first or second raised frame layer (110, 114). Such additional raised frame layer(s) may be positioned according to any of the positions of the first or second raised frame layer (110, 114) illustrated in FIGS. 2-5 and described herein.

Optionally, the raised frame BAW device may be a free-standing bulk acoustic resonator (FBAR). In such cases, an air cavity (104) may be included adjacent to or near the bottom surface of the second electrode (106). The air cavity (104) is defined by the geometry of the second electrode (106) and the substrate (102). One or more layers, such as a layer for passivation (115), may be positioned between the second electrode (106) and the substrate (102).

Optionally, the raised frame BAW device may be a solidly mounted resonator (SMR). In such cases, a solid acoustic mirror may be disposed between the second electrode and the substrate. The acoustic mirror may comprise acoustic Bragg reflectors. The acoustic Bragg reflectors may comprise alternating low impedance layers and high impedance layers. For example, the Bragg reflectors may comprise alternating $SiO_2$ layers as low impedance layers and tungsten layers as high impedance layers.

Figure 9:
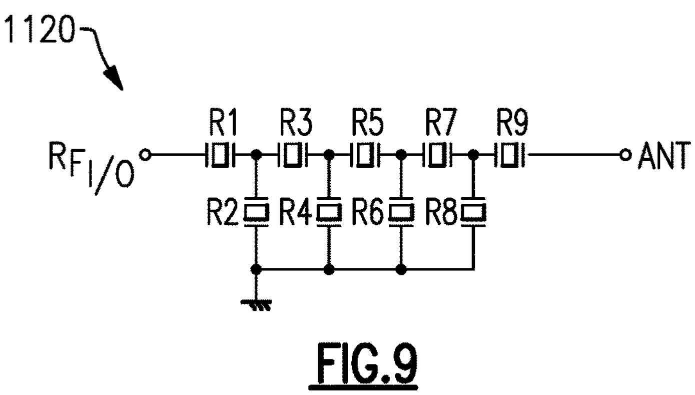
FIG. 9 is a schematic diagram of an example of an acoustic wave ladder filter.

FIG. 9 is a schematic diagram of an example of an acoustic wave ladder filter (1120). The acoustic wave ladder filter (1120) can be a transmit filter or a receive filter. The acoustic wave ladder filter (1120) can be a band pass filter arranged to filter a radio frequency signal. The acoustic wave filter (1120) comprises series resonators R1, R3, R5, R7, and R9 and shunt resonators R2, R4, R6, and R8 coupled between a radio frequency input/output port $RF_{I/O}$ and an antenna port ANT. The radio frequency input/output port $RF_{I/O}$ can be a transmit port in a transmit filter or a receive port in a receive filter. One or more of the illustrated acoustic wave resonators can be a raised frame BAW resonator in accordance with any suitable principles and advantages discussed herein. An acoustic wave ladder filter can comprise any suitable number of series resonators and any suitable number of shunt resonators.

An acoustic wave filter can be arranged in any other suitable filter topology, such as a lattice topology or a hybrid ladder and lattice topology. A BAW resonator in accordance with any suitable principles and advantages disclosed herein can be implemented in a band pass filter. In some other applications, a BAW resonator in accordance with any suitable principles and advantages disclosed herein can be implemented in a band stop filter.

Figure 10A:
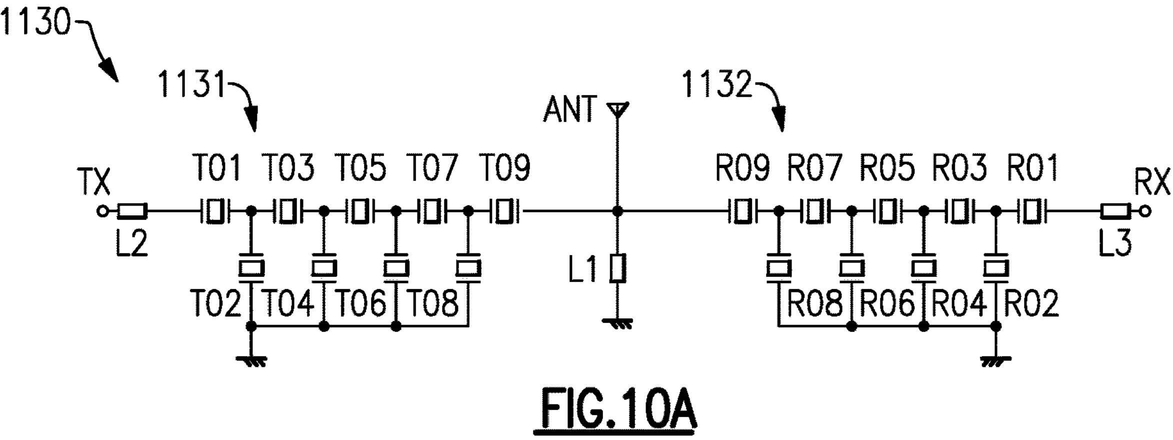
FIG. 10A is a schematic diagram of an example of a duplexer.

FIG. 10A is a schematic diagram of an example of a duplexer (1130). The duplexer (1130) comprises a transmit filter (1131) and a receive filter (1132) coupled to each other at an antenna node ANT. A shunt inductor LI can be connected to the antenna node ANT. The transmit filter (1131) and the receive filter (1132) are both acoustic wave ladder filters in the duplexer (1130).

The transmit filter (1131) can filter a radio frequency signal and provide a filtered radio frequency signal to the antenna node ANT. A series inductor L2 can be coupled between a transmit input node TX and the acoustic wave resonators of the transmit filter (1131). The illustrated transmit filter (1131) comprises acoustic wave resonators T01 to T09. One or more of these resonators can be a raised frame BAW resonator in accordance with any suitable principles and advantages disclosed herein. The illustrated receive filter comprises acoustic wave resonators R01 to R09. One or more of these resonators can be a raised frame BAW resonator in accordance with any suitable principles and advantages disclosed herein. The receive filter can filter a radio frequency signal received at the antenna node ANT. A series inductor L3 can be coupled between the resonator and a receive output node RX. The receive output node RX of the receive filter provides a radio frequency receive signal.

Figure 10B:
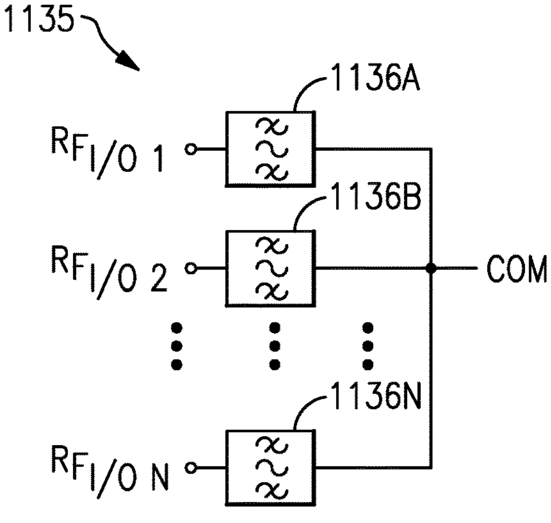
FIG. 10B is a schematic diagram of an example of a multiplexer.

FIG. 10B is a schematic diagram of a multiplexer (1135) that comprises an acoustic wave filter according to an embodiment. The multiplexer (1135) comprises a plurality of filters (1136A to 1136N) coupled together at a common node COM. The plurality of filters can comprise any suitable number of filters including, for example, 3 filters, 4 filters, 5 filters, 6 filters, 7 filters, 8 filters, or more filters. Some or all of the plurality of acoustic wave filters can be acoustic wave filters. Each of the illustrated filters (1136A, 1136B, 1136N) is coupled between the common node COM and a respective input/output node $RF_{I/O1}$, $RF_{I/O2}$, and $RF_{I/ON}$.

In some instances, all filters of the multiplexer (1135) can be receive filters. According to some other instances, all filters of the multiplexer (1135) can be transmit filters. In various applications, the multiplexer (1135) can comprise one or more transmit filters and one or more receive filters. Accordingly, the multiplexer (1135) can comprise any suitable number of transmit filters and any suitable number of receive filters. Each of the illustrated filters can be band pass filters having different respective pass bands.

The multiplexer (1135) is illustrated with hard multiplexing with the filters (1136A to 1136N) having fixed connections to the common node COM. In some other applications, one or more of the filters of a multiplexer can be electrically connected to the common node by a respective switch. Any of such filters can comprise a BAW resonator according to any suitable principles and advantages disclosed herein.

A first filter (1136A) is an acoustic wave filter having a first pass band and arranged to filter a radio frequency signal. The first filter (1136A) can comprise one or more BAW resonators according to any suitable principles and advantages disclosed herein. A second filter (1136B) has a second pass band. A raised frame structure of one or more BAW resonators of the first filter (1136A) can move a raised frame mode of the one or more BAW resonators away from the second passband. This can increase a reflection coefficient (Gamma) of the first filter (1136A) in the pass band of the second filter (1136B). The raised frame structure of the BAW resonator of the first filter (1136A) also move the raised frame mode away from the passband of one or more other filters of the multiplexer (1135).

In certain instances, the common node COM of the multiplexer (1135) is arranged to receive a carrier aggregation signal including at least a first carrier associated with the first passband of the first filter (1136A) and a second carrier associated with the second passband of the second filter (1136B). A raised frame structure of a BAW resonator of the first filter (1136A) can maintain and/or increase a reflection coefficient of the first filter (1136A) in the second passband of the second filter (1136B) that is associated with the second carrier of the carrier aggregation signal.

The filters (1136B to 1136N) of the multiplexer (1135) can comprise one or more acoustic wave filters, one or more acoustic wave filters that comprise at least one BAW resonator with a raised frame structure, one or more LC filters, one or more hybrid acoustic wave LC filters, or any suitable combination thereof.

The raised frame BAW resonators disclosed herein can be implemented in a variety of packaged modules. Some example packaged modules will now be discussed in which any suitable principles and advantages of the BAW devices disclosed herein can be implemented. The example packaged modules can comprise a package that encloses the illustrated circuit elements. The illustrated circuit elements can be disposed on a common packaging substrate. The packaging substrate can be a laminate substrate, for example. FIGS. 14, 15A, 15B, and 16 are schematic block diagrams of illustrative packaged modules according to certain embodiments. Certain example packaged modules comprise one or more radio frequency amplifiers, such as one or more power amplifiers and/or one or more low noise amplifiers. Any suitable combination of features of these modules can be implemented with each other. While duplexers are illustrated in the example packaged modules of FIGS. 14, 15A, and 16, any other suitable multiplexer that comprises a plurality of acoustic wave filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

FIG. 11 is a schematic block diagram of a module (1140) that comprises duplexers (1141A to 1141N) and an antenna switch (1142). One or more filters of the duplexers (1141A to 1141N) can comprise any suitable number of raised frame BAW resonators in accordance with any suitable principles and advantages discussed herein. Any suitable number of duplexers (1141A to 1141N) can be implemented. The antenna switch (1142) can have a number of throws corresponding to the number of duplexers (1141A to 1141N). The antenna switch (1142) can electrically couple a selected duplexer to an antenna port of the module (1140).

FIG. 12A is a schematic block diagram of a module (1150) that comprises a power amplifier (1152), a radio frequency switch (1154), and duplexers (1141A to 1141N) in accordance with one or more embodiments. The power amplifier (1152) can amplify a radio frequency signal. The radio frequency switch (1154) can be a multi-throw radio frequency switch. The radio frequency switch (1154) can electrically couple an output of the power amplifier (1152) to a selected transmit filter of the duplexers (1141A to 1141N). One or more filters of the duplexers (1141A to 1141N) can comprise any suitable number of raised frame BAW resonators in accordance with any suitable principles and advantages discussed herein. Any suitable number of duplexers (1141A to 1141N) can be implemented.

FIG. 12B is a schematic block diagram of a module (1155) that comprises filters (1156A to 1156N), a radio frequency switch (1157), and a low noise amplifier (1158) according to an embodiment. One or more filters of the filters (1156A to 1156N) can comprise any suitable number of raised frame BAW resonators in accordance with any suitable principles and advantages disclosed herein. Any suitable number of filters (1156A to 1156N) can be implemented. The illustrated filters (1156A to 1156N) are receive filters. In some embodiments (not illustrated), one or more of the filters (1156A to 1156N) can be included in a multiplexer that also comprises a transmit filter. The radio frequency switch (1157) can be a multi-throw radio frequency switch. The radio frequency switch (1157) can electrically couple an output of a selected filter of filters (1156A to 1156N) to the low noise amplifier (1157). In some embodiments (not illustrated), a plurality of low noise amplifiers can be implemented. The module (1155) can comprise diversity receive features in certain applications.

FIG. 13 is a schematic block diagram of a module (1160) that comprises a power amplifier (1152), a radio frequency switch (1154), and a duplexer (1141) that comprises a raised frame BAW device in accordance with one or more embodiments, and an antenna switch (1142). The module (1160) can comprise elements of the module (1140) and elements of the module (1150).

Figure 14A:
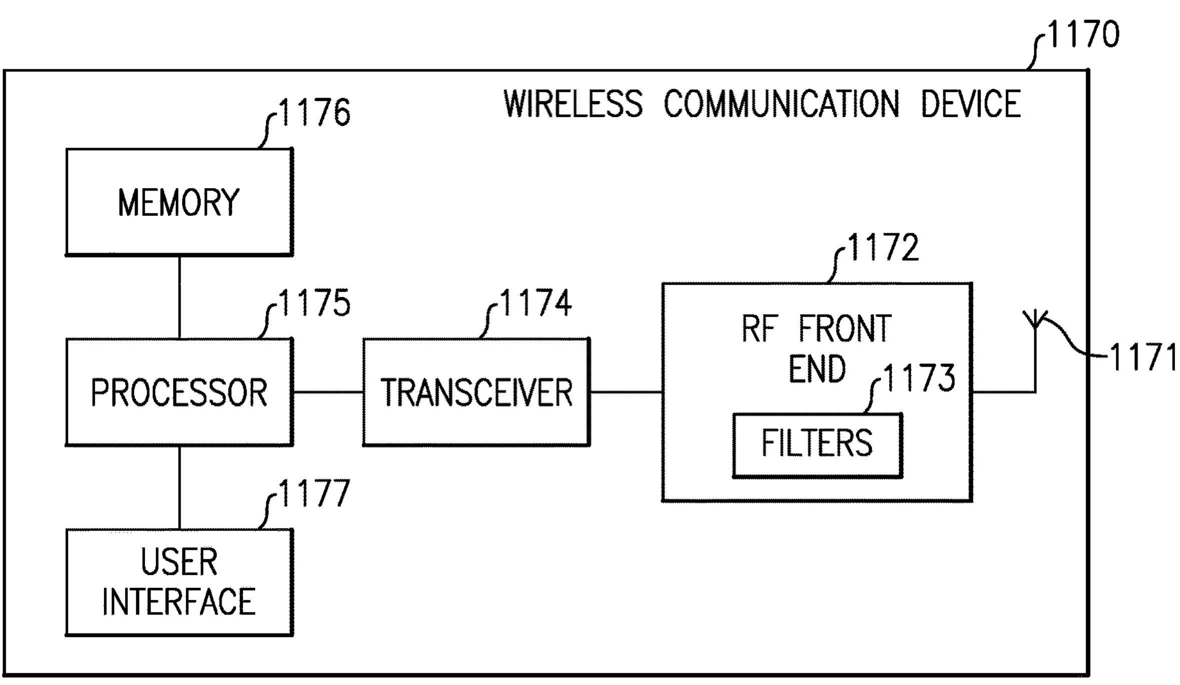
FIG. 14A is a schematic block diagram of a wireless communication device that includes filters that include one or more raised frame bulk acoustic wave devices.

One or more filters with any suitable number of multilayer raised frame bulk acoustic devices can be implemented in a variety of wireless communication devices. FIG. 14A is a schematic block diagram of a wireless communication device (1170) that comprises a filter or filters (1173) with one or more raised frame BAW resonators in accordance with any suitable principles and advantages disclosed herein. The wireless communication device (1170) can be any suitable wireless communication device. For instance, a wireless communication device (1170) can be a mobile phone, such as a smart phone. As illustrated, the wireless communication device (1170) comprises an antenna (1171), a radio frequency (RF) front end (1172) that comprises filters (1173), an RF transceiver (1174), a processor (1175), a memory (1176), and a user interface (1177). The antenna (1171) can transmit RF signals provided by the RF front end (1172). The antenna (1171) can provide received RF signals to the RF front end (1172) for processing.

The RF front end (1172) can comprise one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end (1172) can transmit and receive RF signals associated with any suitable communication standards. Any of the raised frame BAW resonators disclosed herein can be implemented in filters (1173) of the RF front end (1172).

The RF transceiver (1174) can provide RF signals to the RF front end (1172) for amplification and/or other processing. The RF transceiver (1174) can also process an RF signal provided by a low noise amplifier of the RF front end (1172). The RF transceiver (1174) is in communication with the processor (1175). The processor (1175) can be a baseband processor. The processor (1175) can provide any suitable base band processing functions for the wireless communication device (1170). The memory (1176) can be accessed by the processor (1175). The memory (1176) can store any suitable data for the wireless communication device (1170). The processor (1175) is also in communication with the user interface (1177). The user interface (1177) can be any suitable user interface, such as a display.

Figure 14B:
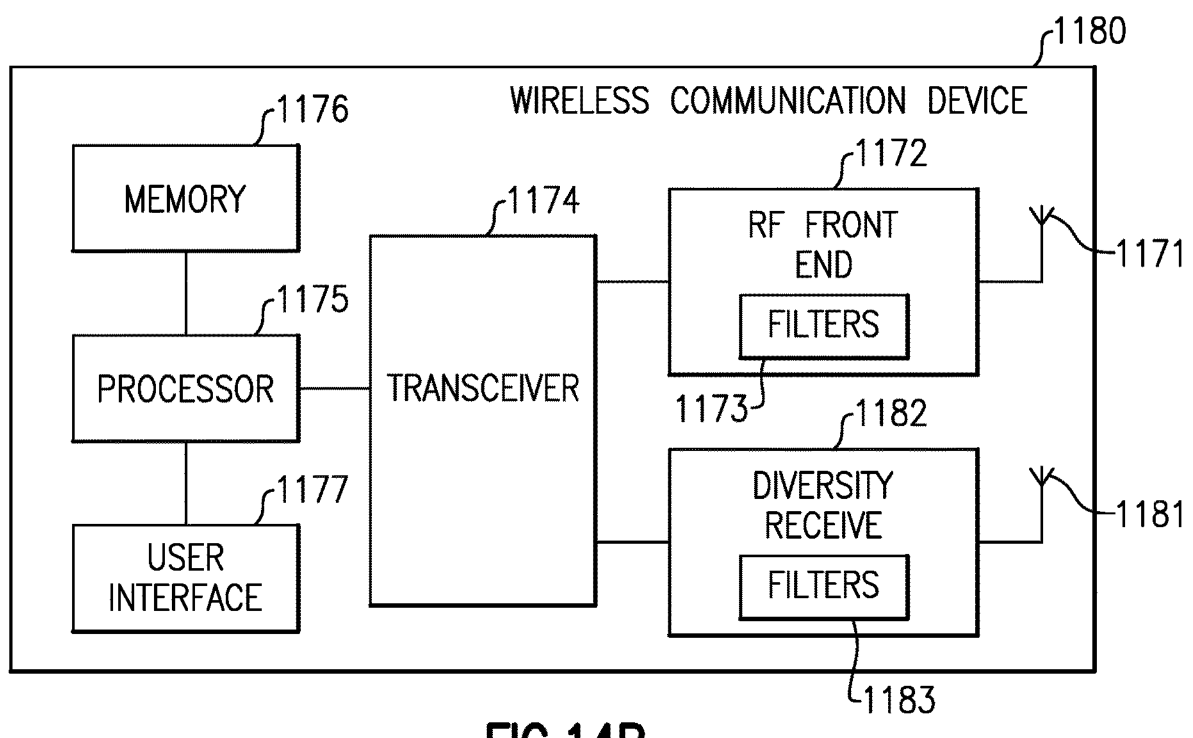
FIG. 14B is a schematic block diagram of another wireless communication device that includes filters that include one or more raised frame bulk acoustic wave devices.

FIG. 14B is a schematic diagram of a wireless communication device (1180) that comprises filters (1173) in a radio frequency front end (1172) and second filters (1183) in a diversity receive module (1182). The wireless communication device (1180) is like the wireless communication device (1170) of FIG. 14A, except that the wireless communication device (1180) also comprises diversity receive features. As illustrated in FIG. 14B, the wireless communication device (1180) comprises a diversity antenna (1181), a diversity module (1182) configured to process signals received by the diversity antenna (1181) and including filters (1183), and a transceiver (1174) in communication with both the radio frequency front end (1172) and the diversity receive module (1182). One or more of the second filters (1183) can comprise a BAW resonator with a raised frame structure in accordance with any suitable principles and advantages disclosed herein.

Bulk acoustic wave devices disclosed herein can be included in a filter and/or a multiplexer arranged to filter a radio frequency signal in a fifth generation (5G) New Radio (NR) operating band within Frequency Range 1 (FR1). FR1 can from 410 megahertz (MHz) to 7.125 gigahertz (GHz), for example, as specified in a current 5G NR specification. A filter arranged to filter a radio frequency signal in a 5G NR FR1 operating band can comprise one or more BAW resonators be implemented in accordance with any suitable principles and advantages disclosed herein.

5G NR carrier aggregation specifications can present technical challenges. For example, 5G carrier aggregations can have wider bandwidth and/or channel spacing than fourth generation (4G) Long Term Evolution (LTE) carrier aggregations. Carrier aggregation bandwidth in certain 5G FR1 applications can be in a range from 120 MHz to 400 MHz, such as in a range from 120 MHz to 200 MHz. Carrier spacing in certain 5G FR1 applications can be up to 100 MHz. Bulk acoustic wave resonators with a raised frame structure disclosed herein can achieve low insertion loss and low Gamma loss. The frequency of a raised frame mode of such a BAW resonator can be moved significantly away from a resonant frequency of the BAW resonator. Accordingly, the raised frame mode can be outside of a carrier aggregation band even with the wider carrier aggregation bandwidth and/or channel spacing within FR1 in 5G specifications. This can reduce and/or eliminate Gamma degradation in an operating band of another carrier of a carrier aggregation. In some instances, Gamma can be increased in the operating band of the other carrier of the carrier aggregation.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure comprises some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of this disclosure. Accordingly, the foregoing description and drawings are by way of example only, and the scope of the disclosure should be determined from proper construction of the appended claims, and their equivalents.

What is claimed is:

1. A bulk acoustic wave (BAW) device comprising:
a first electrode;
a second electrode;
a piezoelectric layer positioned between the first electrode and the second electrode; and
a raised frame structure outside of a middle area of an active domain of the BAW device, the raised frame structure comprising one or more raised frame layer(s), at least one of the one or more raised frame layer(s) comprising a tapered portion tapering in a direction towards the middle area of the active domain, the raised frame structure comprising a first raised frame layer and a second raised frame layer, the first raised frame layer being supported by the first electrode away from the piezoelectric layer, the first raised frame layer partially covering the first electrode and leaving at least the middle area of the active domain uncovered by the first raised frame layer.

2. The BAW device of claim 1 wherein the second raised frame layer is located between the first electrode and the second electrode.

3. The BAW device of claim 2 wherein the second raised frame layer is positioned between the piezoelectric layer and the first electrode.

4. The BAW device of claim 2 wherein the second raised frame layer is positioned between the piezoelectric layer and the second electrode.

5. The BAW device of claim 1 wherein the second raised frame layer has a lower acoustic impedance than at least one of the first electrode or the second electrode.

6. The BAW device of claim 1 wherein at least one of the first raised frame layer or the second raised frame layer comprises a tapered portion.

7. The BAW device of claim 1 wherein the first raised frame layer has a tapered portion having a taper angle, $\alpha$, of $5° \leq \alpha \leq 50°$, and/or the second raised frame layer has a tapered portion having a taper angle, $\beta$, of $5° \leq \beta \leq 50°$, and/or the first raised frame layer has a tapered portion having a taper angle, $\alpha$, of $5° \leq \alpha \leq 30°$ and/or the second raised frame layer has a tapered portion having a taper angle, $\beta$, of $5° \leq \beta \leq 30°$.

8. The BAW device of claim 7 wherein the taper angle $\alpha$ is not equal to the taper angle $\beta$.

9. The BAW device of claim 1 wherein a thickness of the first raised frame layer is within a range of $0.03\lambda$ to $0.3\lambda$, $\lambda$ being $\lambda=2h$, h being a thickness of a middle area of the BAW device.

10. The BAW device of claim 1 wherein the second raised frame layer is configured to move a frequency of a raised frame mode away from a main resonant frequency of the BAW device.

11. The BAW device of claim 1 wherein an acoustic impedance of the second raised frame layer is lower than an acoustic impedance of the piezoelectric layer.

12. The BAW device of claim 1 wherein the second raised frame layer comprises one or more of silicon dioxide ($SiO_2$), silicon nitride (SiN), silicon carbide (SiC), Al, Ti, or Be.

13. The BAW device of claim 1 wherein the second raised frame layer is disposed along an edge of the active domain.

14. The BAW device of claim 1 comprising at least one passivation layer covering at least a part of the raised frame structure and at least a part of the first electrode and including one or more recesses in the middle area of the active domain.

15. The BAW device of claim 1 wherein the first raised frame layer and the piezoelectric layer are disposed on opposite sides of the first electrode, and the second raised frame layer is positioned between the piezoelectric layer and the first electrode.

16. The BAW device of claim 1 wherein the first raised frame layer has a higher density than the piezoelectric layer.

17. The BAW device of claim 1 wherein the first raised frame layer comprises a same material as the first electrode.

18. The BAW device of claim 1 comprising an air cavity wherein the second electrode is between the first electrode and the air cavity.

19. The BAW device of claim 1 comprising an air cavity wherein the air cavity and the piezoelectric layer are positioned on opposite sides of the second electrode.

20. The BAW device of claim 1 comprising an acoustic Bragg reflector wherein the second electrode is between the first electrode and the acoustic Bragg reflector.

21. The BAW device of claim 1 comprising an acoustic Bragg reflector wherein the acoustic Bragg reflector and the piezoelectric layer are positioned on opposite sides of the second electrode.

22. A packaged module comprising:

a packaging substrate;

an acoustic wave filter on the packaging substrate and configured to filter a radio frequency signal, the acoustic wave filter including a bulk acoustic wave (BAW) device, the BAW device having a first electrode, a second electrode, a piezoelectric layer positioned between the first electrode and the second electrode, and a raised frame structure outside of a middle area of an active domain of the BAW device, the raised frame structure comprising one or more raised frame layer(s), at least one of the one or more raised frame layer(s) comprising a tapered portion tapering in a direction towards the middle area of the active domain, the raised frame structure comprising a first raised frame layer and a second raised frame layer, the first raised frame layer being supported by the first electrode away from the piezoelectric layer, the first raised frame layer partially covering the first electrode and leaving at least the middle area of the active domain uncovered by the first raised frame layer; and a radio frequency component electrically coupled to the acoustic wave filter and positioned on the packaging substrate, the acoustic wave filter and the radio frequency component being enclosed within a common package.

23. The packaged module of claim 22 wherein the radio frequency component comprises at least one of a radio frequency amplifier or a radio frequency switch.

24. A wireless mobile device comprising a packaged module, the packaged module comprising:

a packaging substrate;

an acoustic wave filter on the packaging substrate and configured to filter a radio frequency signal, the acoustic wave filter including a bulk acoustic wave (BAW) device, the BAW device having a first electrode, a second electrode, a piezoelectric layer positioned between the first electrode and the second electrode, and a raised frame structure outside of a middle area of an active domain of the BAW device, the raised frame structure comprising one or more raised frame layer(s), at least one of the one or more raised frame layer(s) comprising a tapered portion tapering in a direction towards the middle area of the active domain, the raised frame structure comprising a first raised frame layer and a second raised frame layer, the first raised frame layer being supported by the first electrode away from the piezoelectric layer, the first raised frame layer partially covering the first electrode and leaving at least the middle area of the active domain uncovered by the first raised frame layer; and a radio frequency component electrically coupled to the acoustic wave filter and positioned on the packaging substrate, the acoustic wave filter and the radio frequency component being enclosed within a common package.

* * * * *